United States Patent
Johnson et al.

(10) Patent No.: US 10,593,392 B1
(45) Date of Patent: Mar. 17, 2020

(54) APPARATUSES AND METHODS FOR MULTI-BANK REFRESH TIMING

(71) Applicant: Micron Technology, Inc., Boise, ID (US)

(72) Inventors: Jason M. Johnson, Nampa, ID (US); Christopher G. Wieduwilt, Boise, ID (US); Daniel S. Miller, Boise, ID (US); Yoshinori S. Fujiwara, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/226,525

(22) Filed: Dec. 19, 2018

(51) Int. Cl.
*G11C 11/40* (2006.01)
*G11C 11/406* (2006.01)
*G11C 5/14* (2006.01)
*G11C 11/4091* (2006.01)
*G11C 8/10* (2006.01)
*G11C 11/4074* (2006.01)

(52) U.S. Cl.
CPC ........ *G11C 11/40618* (2013.01); *G11C 5/145* (2013.01); *G11C 8/10* (2013.01); *G11C 11/4074* (2013.01); *G11C 11/4091* (2013.01); *G11C 11/40611* (2013.01)

(58) Field of Classification Search
CPC ......... G11C 11/40618; G11C 11/40611; G11C 11/4074; G11C 5/145; G11C 11/4091; G11C 8/10; G11C 11/40607; G11C 29/783; G06F 13/1636
See application file for complete search history.

(56) References Cited

U.S. PATENT DOCUMENTS

2016/0163377 A1* 6/2016 Oh .................... G11C 11/40615 365/222
2016/0254044 A1* 9/2016 Bains ................ G11C 11/40618 365/203

* cited by examiner

*Primary Examiner* — Ajay Ojha
(74) *Attorney, Agent, or Firm* — Dorsey & Whitney LLP

(57) ABSTRACT

Embodiments of the disclosure are drawn to apparatuses and methods for timing refresh operations in a memory device. An apparatus may include an oscillator that provides a periodic signal to one or more refresh timer circuits. Each of the refresh timer circuits is associated with a respective memory bank in the memory device. The refresh timer may include a counter block and a control logic block. The control logic block may gate the periodic signal to the counter block. The counter block may count the row active signal time and the row precharge time. The counter signals may be used by the control logic block to output a number of pumps of a refresh operation.

21 Claims, 8 Drawing Sheets

APPARATUSES AND METHODS FOR MULTI-BANK REFRESH TIMING

BACKGROUND

This disclosure relates generally to semiconductor devices, and more specifically to semiconductor memory devices. In particular, the disclosure relates to volatile memory, such as dynamic random access memory (DRAM). DRAM may be included in high bandwidth memory (HBM). HBM may include a die stack with one or more banks of memory on each die.

Volatile memory requires periodic refreshing of the data in the memory to preserve the data. As the number of memory banks increases in traditional DRAM and in HBM, timing of memory refresh cycles may become more difficult and/or require the inclusion of more memory components.

DETAILED DESCRIPTION

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

As the timing specifications of memory devices continue to tighten and the number of memory banks included in memory devices increases, it may be more difficult for properly timing refresh operations in the memory becomes more difficult. Moreover, additional timing components may be required, which consumes die area, and trimming the timing of additional components may increase production and testing phases of memory device manufacture.

Figure 1:
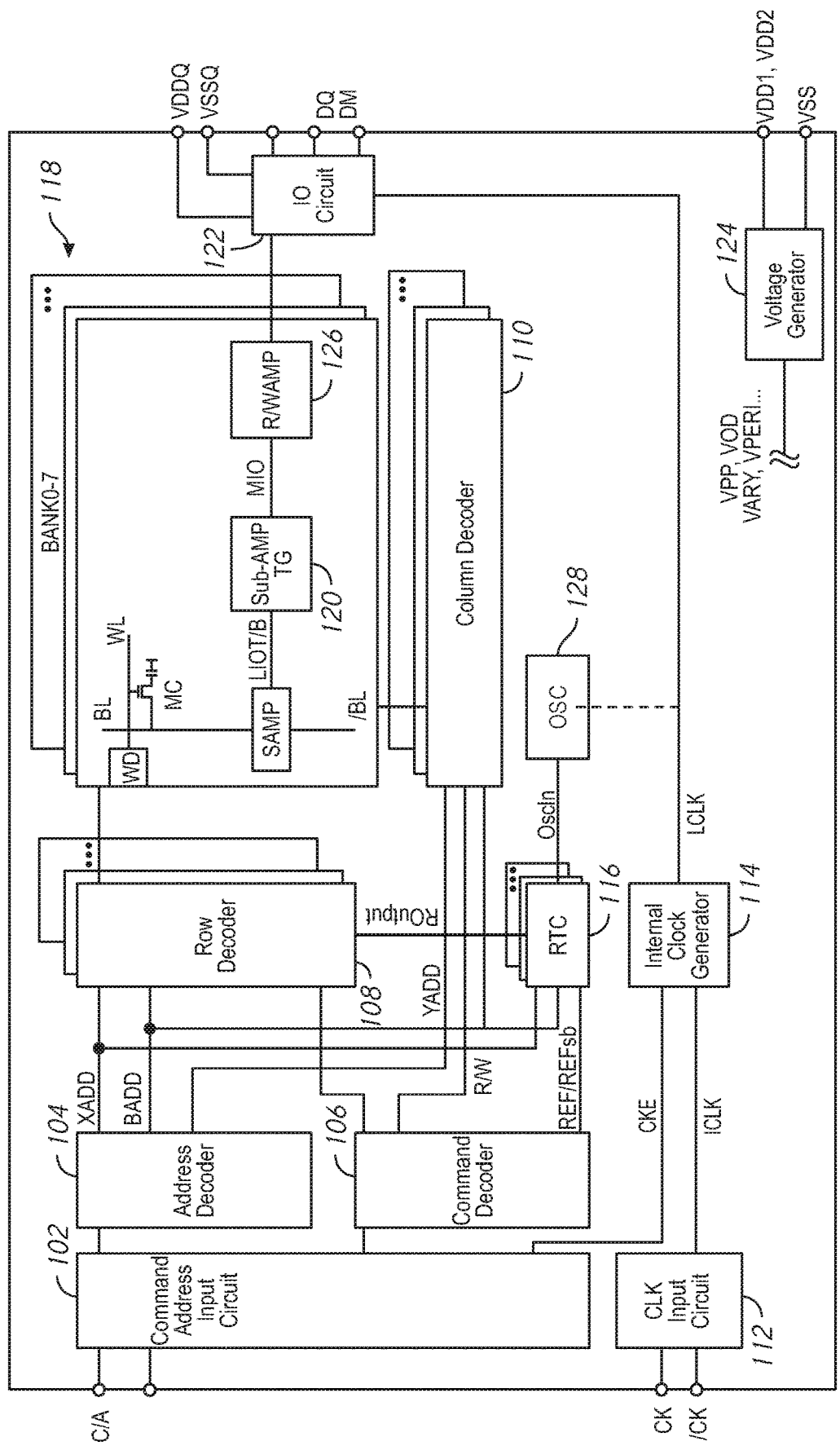
FIG. 1 is a block diagram of a semiconductor device according to an embodiment of the present disclosure.

FIG. 1 is a block diagram showing an overall configuration of a semiconductor device 100 according to at least one embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 in other embodiments. Each memory bank includes a plurality of word lines WL, a plurality of bit lines BL and /BL, and a plurality of memory cells MC arranged at intersections of the plurality of word lines WL and the plurality of bit lines BL and /BL. The selection of the word line WL is performed by a row decoder 108 and the selection of the bit lines BL and /BL is performed by a column decoder 110. A selected word line WL may be driven to a desired charge by word line driver WD. In the embodiment of FIG. 1, the row decoder 108 includes a respective row decoder for each memory bank and the column decoder 110 includes a respective column decoder for each memory bank. The bit lines BL and /BL are coupled to a respective sense amplifier (SAMP).

Read data from the bit line BL or/BL is amplified by the sense amplifier SAMP, and provided to sub-amplifier transfer gate 120 over complementary local data lines (LIOT/B). The sub-amplifier transfer gate 120 may act as a switch to form a conductive path between the appropriate LIOT/B and appropriate shared main data lines (MIO). Read data may pass from the local data lines LIOT/B to the main data lines MIO via a conductive path provided by the sub-amplifier transfer gate 120 to a read amplifier 126, which provides the data to an IO circuit 122. Write data received from IO circuit 122 is output from a write amplifier 126 and provided to the sense amplifier SAMP over the complementary main data lines MIO, the sub-amp transfer gate 120, and the complementary local data lines LIOT/B, and written in the memory cell MC coupled to the bit line BL or/BL.

The semiconductor device 100 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDD1, VDD2, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 110 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are provided, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands by be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line WL and a column command signal to select a bit line BL.

The device 100 may receive an access command which is a read command. When a read command is received, and a bank address, a row address and a column address are timely supplied with the read command, read data is read from memory cells MC in the memory array 118 corresponding to the row address and column address. The read command is received by the command decoder 106 (e.g., command controller), which provides internal commands so that read data from the memory array 218 is provided to the read amplifier 128. The read data is output to outside from the data terminals DQ via the input/output circuit 122.

The device 100 may receive an access command which is a write command. When the write command is received, and a bank address, a row address and a column address are timely supplied with the write command, write data supplied to the data terminals DQ is written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the write amplifier 126, and by the write amplifier 126 to the memory array 118 to be written into the memory cell MC.

The device 100 may also receive commands causing it to carry out a refresh operation. The refresh signal may be a pulse signal which is activated when the command decoder 106 receives a signal which indicates an auto-refresh and/or other refresh command. In some embodiments, the refresh command may be externally issued to the memory device 100. In some embodiments, the refresh command may be periodically generated by a component of the device 100. The refresh signal is provided to the refresh timer circuit (RTC) 116. The refresh timer circuit 116 may also receive a periodic signal OscIn from oscillator circuit (OSC) 128 (e.g., oscillator). In some embodiments, the periodic signal may have a cycle time of 10 nanoseconds or less.

In some embodiments, the oscillator circuit 128 is a circuit separate from the internal clock generator 114. In some embodiments, the oscillator circuit 128 may optionally receive the LCLK signal from the internal clock generator 114. In some embodiments, the device 100 may include a refresh timer circuit 116 for each memory bank and one oscillator circuit 128 for all of the memory banks in the device 100. A refresh command provided to the refresh timer circuit(s) 116 may cause the device 100 to carry out refresh operations for all of the memory banks (e.g., all-bank refresh operation) or carry out refresh operations for one or more (but less than all) of the memory banks (e.g., per bank refresh operation). In some embodiments, the memory bank (s) refreshed for a per bank refresh operation are identified by the bank address BADD provided to the refresh timer circuit(s) 116 from the address decoder 104, and only those refresh timer circuits 116 associated with the bank address BADD respond to receipt of the refresh command. In some embodiments, the bank address BADD may be provided to the command decoder 106, which then provides the REF/REF-sub to the appropriate refresh timer circuits(s) 116.

The refresh timer circuit 116 provides and receives various internal control signals to perform refresh operations. For example, control signals ROutput are provided by the refresh timer circuit 116 to the row decoder 108 and control signal REF/REF-sb may be received by the refresh timer circuit 116 from the command decoder 106.

Refresh operations are performed over a refresh cycle time. The command decoder 106 and refresh timer circuit 116 provide the REF/REF-sb and ROutput signals, respectively, having a timing that performs refresh operations within the refresh cycle time. For example, the command decoder 106 and refresh timer circuit 116 provide the control signals to have multiple consecutive refresh activations within a refresh cycle time. In some embodiments, each of the refresh activations may be used to refresh different groups of memory cells (e.g., different rows of memory cells). The command decoder 106 and the refresh timer circuit 116 provide the control signals with sufficient timing control to perform multiple activations during a refresh cycle time although timing margins may be small. In an embodiment of the disclosure, the command decoder 106 and the refresh timer circuit 116 provide the REF/REF-sb and ROutput signals to include two consecutive refresh activations within a refresh cycle time (e.g., double pump refresh). All-bank refresh operations and/or per bank refresh operations may have multiple refresh activations for a refresh cycle. The refresh timer circuit 116 may use the periodic signal from the oscillator circuit 128 to count to certain time values to time a refresh signal provided to one or more memory banks. In some embodiments, tRAS and tRP may be used.

Power supply terminals of device 100 are supplied with power supply potentials VDD1, VDD2, and VSS. The power supply potentials VDD1, VDD2, and VSS are supplied to an internal voltage generator circuit 124. The internal voltage generator circuit 124 generates various internal potentials VPP, VOD, VARY, VPERI, and the like based on the power supply potentials VDD1, VDD2, and VSS supplied to the power supply terminals. While the various internal potentials and power supply potentials may be used for any of the different circuits of the device 100, the internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
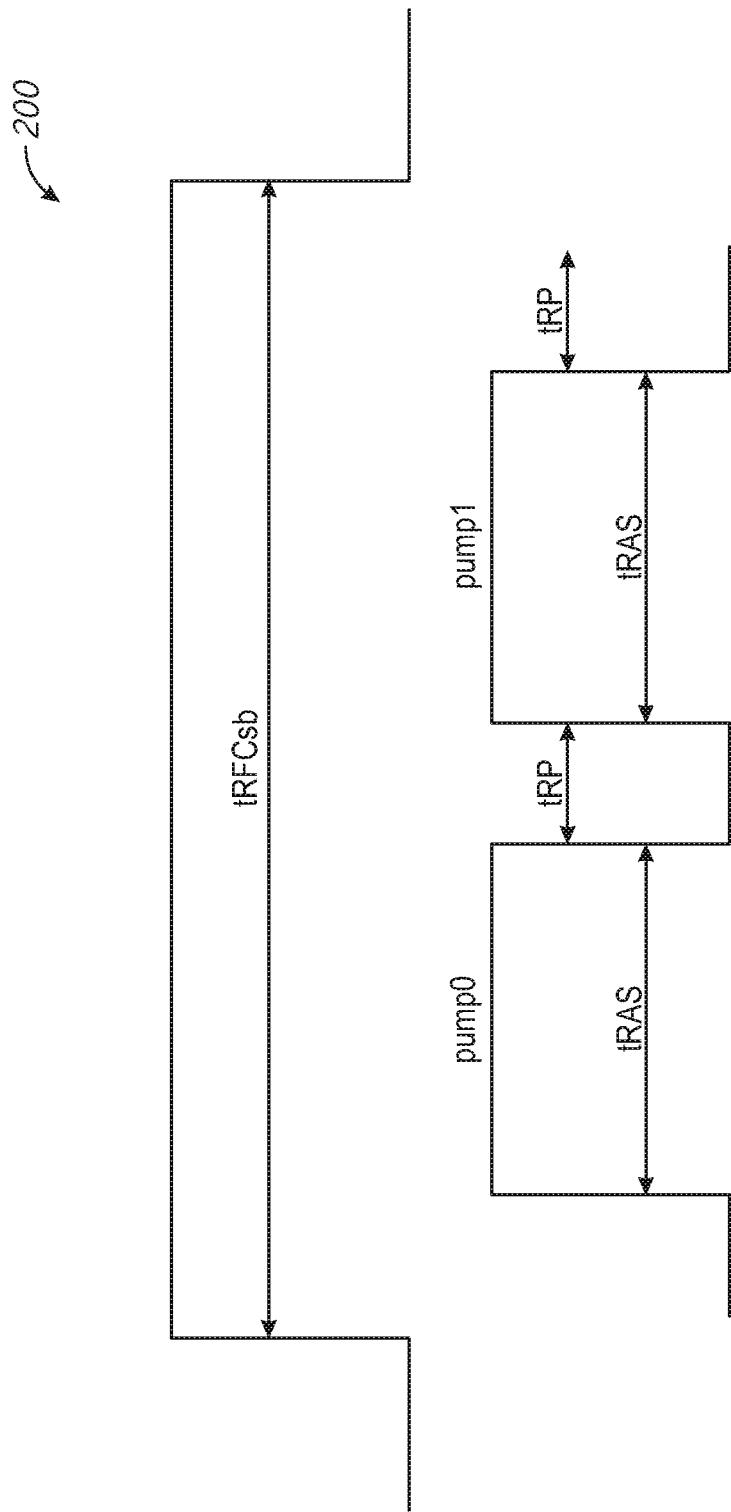
FIG. 2 is a timing diagram of a refresh cycle.

FIG. 2 is a timing diagram 200 of a refresh operation of a memory. The refresh operation may be performed by the semiconductor device 100 of FIG. 1, in some embodiments of the disclosure.

The time allotted for a refresh operation for a single bank in a memory may be referred to as tRFCsb. During the refresh operation, multiple refreshes of the memory bank may occur within tRFCsb. These multiple refreshes may be referred to as "pumps." As shown in FIG. 2, for example, two pumps, pump0 and pump1, are performed during a refresh operation. While two pumps are shown, more or fewer pumps may be performed (e.g., 1, 3, 4, 8 pumps, etc.). Regardless of the number of pumps, all pumps are completed within tRFCsb. The length of time of each pump in the refresh operation may be equal to or substantially similar to the row active time (tRAS) of the memory. The length of time between each pump in the refresh operation may be equal to or substantially similar to the row precharge time (tRP).

Different memory devices have different specifications for refresh timing. For example, high bandwidth memory (HBM) may provide for 200 ns for a single bank refresh. A significant number of memory banks (e.g., 25) may be independently refreshed during a single bank refresh period. In some HBM systems, at least three pumps are required for the refresh operation. Certain DDR memory devices may have similar specifications.

Figure 3:
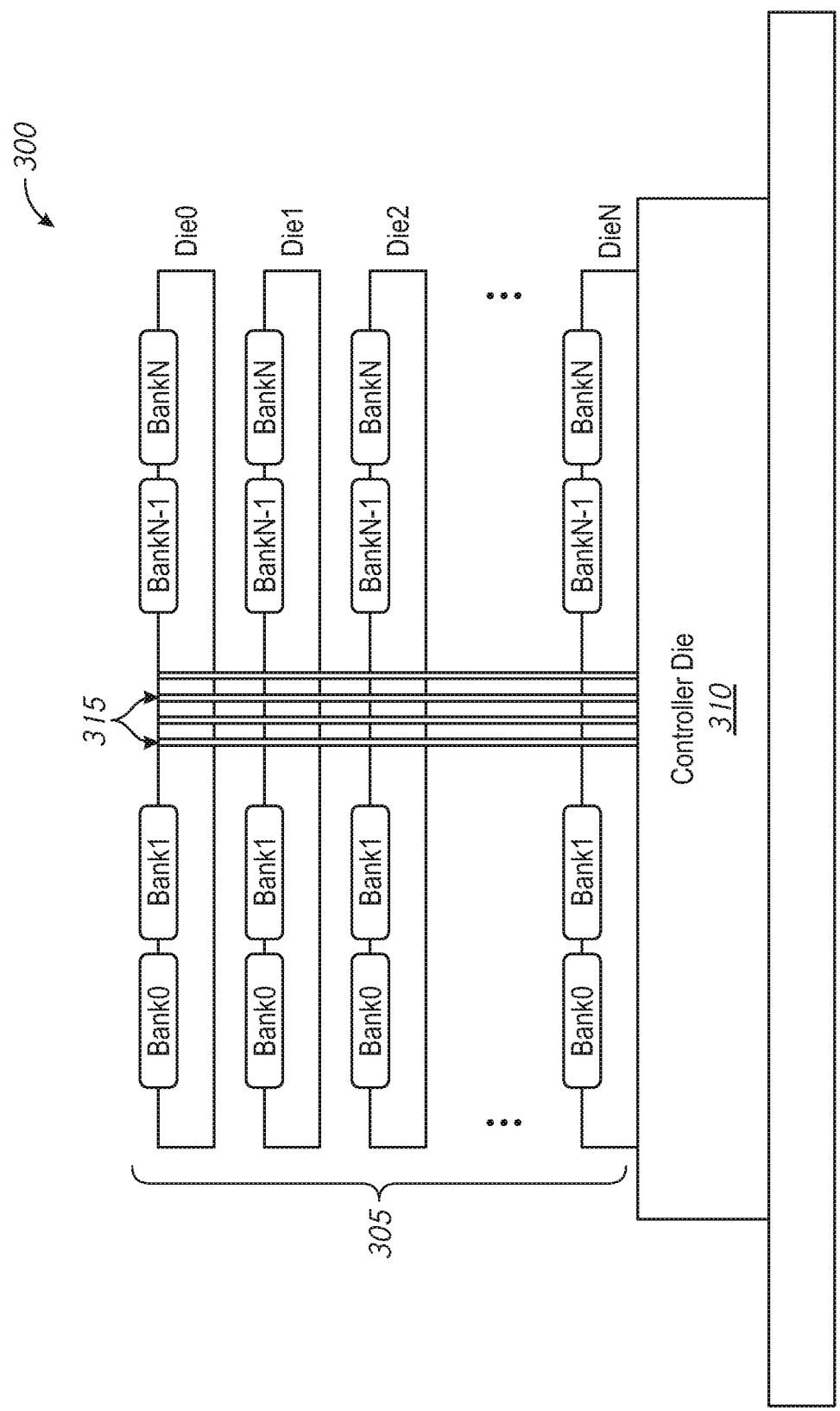
FIG. 3 is a block diagram showing an overall configuration of a semiconductor device including high bandwidth memory (HBM) according to an embodiment of the disclosure.

FIG. 3 is a block diagram showing an overall configuration of a semiconductor device 300 including high bandwidth memory (HBM) according to at least one embodiment of the disclosure. The device 300 may include multiple die, DIE0-N. The device 300 may include any number of die. For example, the number of die may be four. In another example, the number of die may be eight. In some embodiments of the disclosure at least one die of the device 300 includes the semiconductor device 100 of FIG. 1.

Each die may include one or more memory banks, BANK0-N. Each die may include any number of memory banks. For example, a die may include 16 banks, 32 banks, 64 banks, 128 banks, or 256 banks. The die that include memory banks may sometimes be referred to as core die 305, or collectively, as a stack. In some embodiments, device 300 may further include a controller die 310, which may sometimes be referred to as a logic die or interface die. The controller die 310 may include one or more control circuits that provide commands (e.g., memory access commands) and signals (e.g., clock signal) to the core die 305 to perform memory operations. In some embodiments, the controller die 310 may provide access to the core die 305 and to one or more components included in the device 300. For example, the controller die 305 may be coupled to a graphical processing unit (not shown). Conductive paths 315 may couple the die to one another and/or to the controller die 310. In some embodiments, the conductive paths 315 may include through-silicon vias (TSV). In some embodiments, the conductive paths 315 may include solder balls. One or more of the conductive paths 315 may provide one or more channels for data input and output for DIE0-N. In some embodiments, each die DIE0-N may be provided with two channels. In some embodiments, each die DIE0-N may be provided with four channels.

In some embodiments, each die DIE0-N of core die 305 may include some or all of the components as shown and described in device 100 (e.g., row and column decoders, command decoders, IO circuit, etc.). That is, in some embodiments, each die may be similar to a DRAM die in a DDR memory. In some embodiments where each die DIE0-N includes several components for operating the memory, controller die 310 may be omitted from the device 300. In some embodiments, one or more of the components described in device 100 may be included with the controller die 310 (e.g., command decoder, internal clock generator, command address input circuit, etc.). This may save die layout area on the die DIE0-N of the core die 305.

Figure 4:
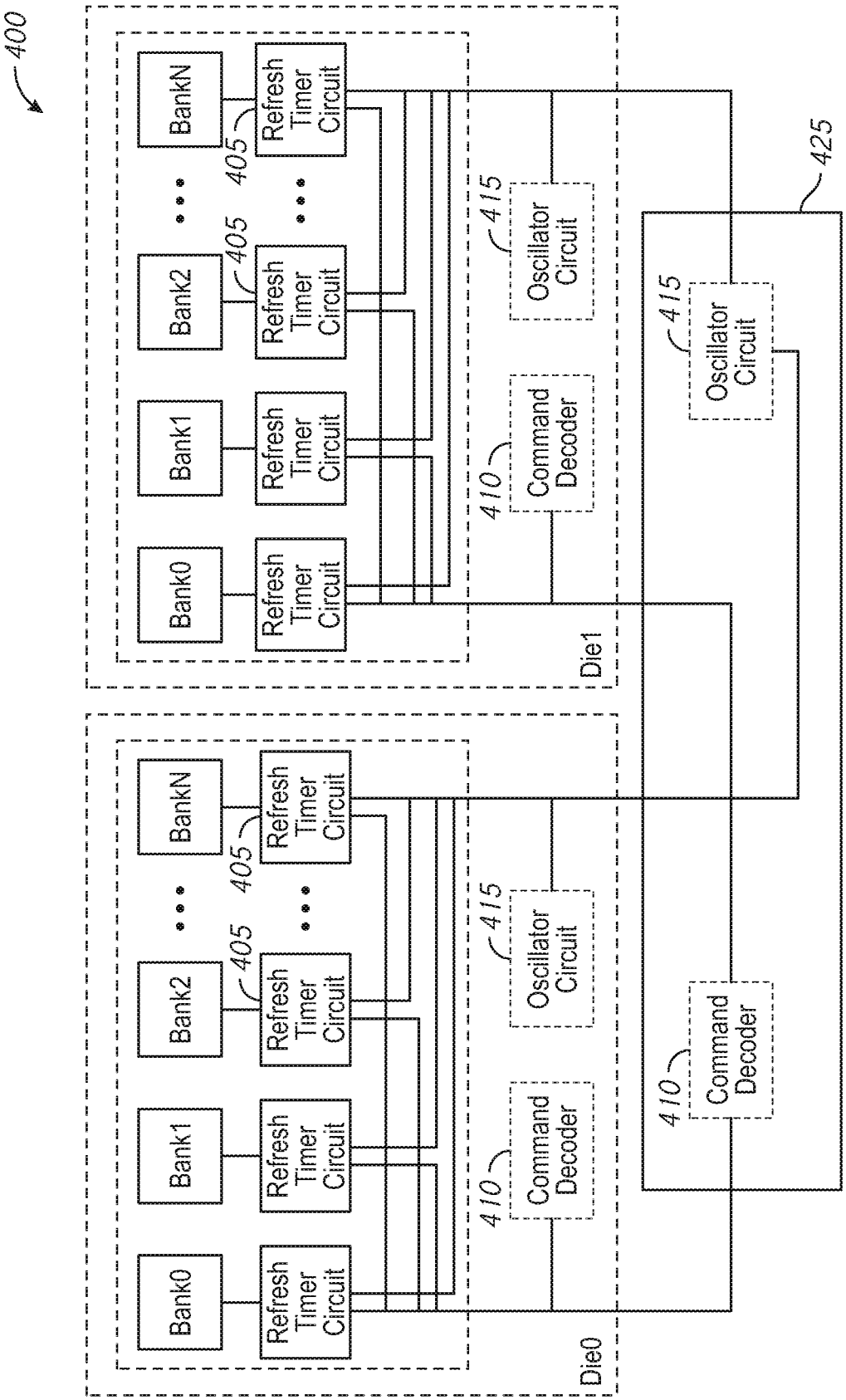
FIG. 4 is a block diagram of a portion of a HBM according to an embodiment of the disclosure.

FIG. 4 is a block diagram of a portion of an HBM 400 according to an embodiment of the disclosure. Portions of two die, DIE0 and DIE1, included in the HBM 400 are shown. The die DIE0 and DIE1 may be die included in a stack. HBM 400 may be included in a device including an HBM such as the device 300 in FIG. 3 in some embodiments. Although the die (e.g., DIE0 and DIE1) are illustrated next to one another, it is understood that die may be stacked vertically in an HBM as shown in FIG. 3. Referring to FIG. 4, each die, DIE0 and DIE1, includes memory banks, BANK0-N. A respective refresh timer circuit 405 may be coupled to each of the memory banks, BANK0-N. Each refresh timer circuit 405 may receive refresh commands from a command decoder 410 and a periodic signal from an oscillator circuit 415. In some embodiments, the refresh timer circuit 405, command decoder 410, and/or oscillator circuit 415 operate as the refresh timer circuit 116, command decoder 106, and/or oscillator circuit 128 as previously described with reference to FIG. 1.

Multiple embodiments are illustrated in FIG. 4 as indicated by the dashed lines for the command decoder 410 and oscillator circuit 415. In some embodiments, each of DIE0 and DIE1 includes an oscillator circuit 415. In other embodiments, DIE0 and DIE1 may receive a periodic signal from a single oscillator circuit 415 located on a separate die 425. In these embodiments, the die 425 may be a die including memory banks similar to DIE0 and DIE1 or it may be a controller die of the HBM 400. In some embodiments, each of DIE0 and DIE1 includes a command decoder 410. In some embodiments, DIE0 and DIE1 may receive commands from a single command decoder 410 on a separate die 425. In some embodiments, the HBM 400 may include multiple oscillator circuits 415 and a single command decoder 410. In some embodiments, a device may include multiple command decoders 410 and a single oscillator circuit 415.

Figure 5:
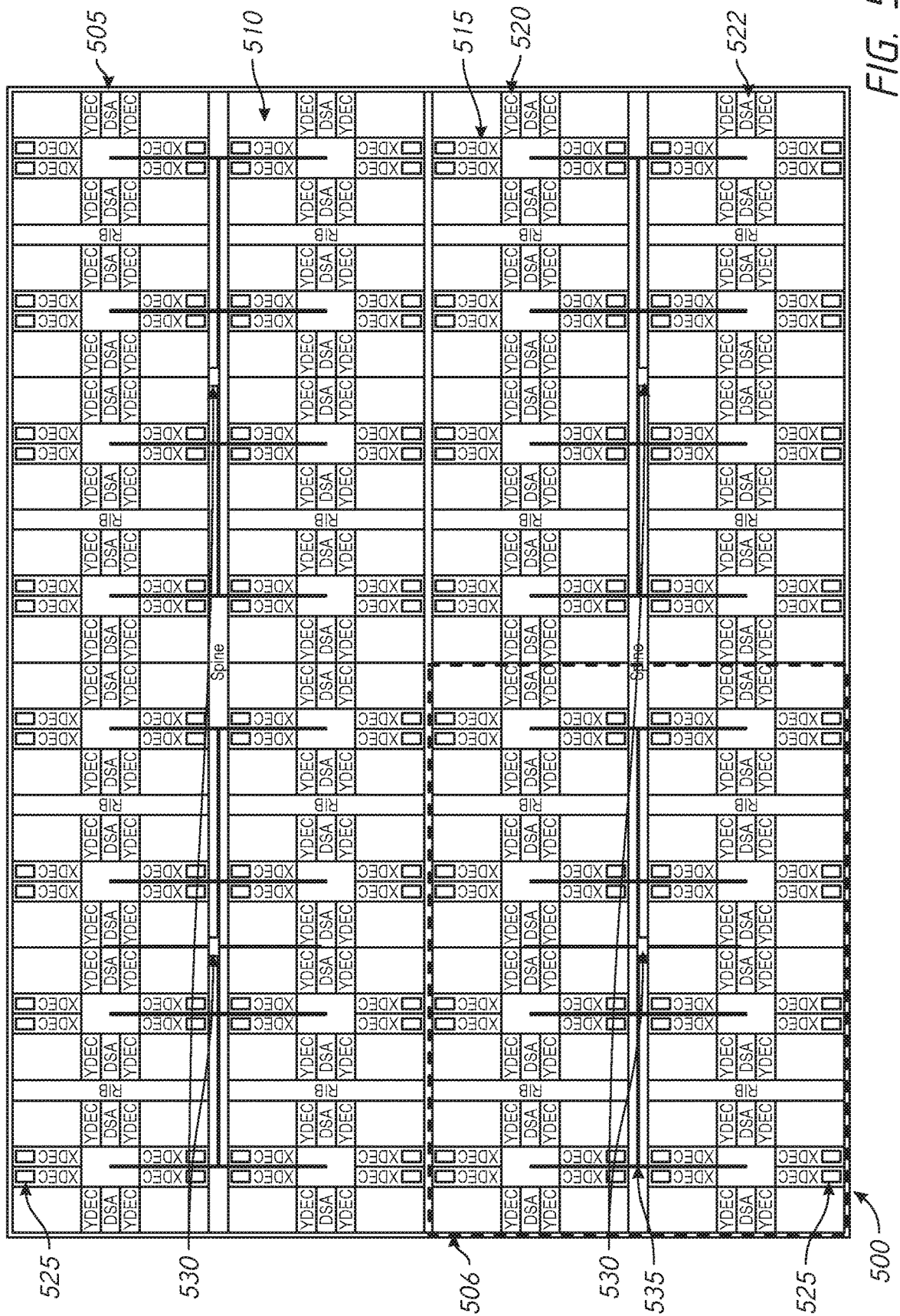
FIG. 5 is a schematic of a portion of a HBM according to an embodiment of the disclosure.

FIG. 5 is a schematic of a portion of an HBM 500 according to an embodiment of the disclosure. HBM 500 may include core die stack 505. Although shown as a single level in FIG. 5, the core die stack 505 may include multiple die stacked vertically, each die of the core die stack 505 including one or more memory banks 510. The core die stack 505 may include multiple memory banks 510. In the example shown in FIG. 5, core die stack 505 includes 128 memory banks 510. For example, each die of the core die stack 505 may include 16 memory banks (e.g., 8 die). In another example, each die of the core die stack 505 may include 32 memory banks (e.g., 4 die). An example delineation of a die having 32 memory banks 510 included in core die stack 505 is illustrated by dashed box 506. In this example, the core die stack 505 may include four core die, each with 32 memory banks 510. The four core die may be stacked vertically.

A row decoder (XDEC) 515 and a column decoder (YDEC) 520 may be provided for each memory bank 510. In the example shown in FIG. 5, the memory banks 510 may share digital sense amplifiers (DSA) 522, but in other examples, each memory bank 510 may have its own digital sense amplifier 522. In some embodiments, memory banks 510 may share other components such as read/write amplifiers and error correction code circuitry (not shown). A refresh timer circuit 525 is associated with each memory bank 510. In some embodiments, the refresh timer circuit 525 may be located adjacent to the row decoder 515. In other embodiments, the refresh timer circuit 525 may be located elsewhere on the core die stack 505. In some embodiments (not shown in FIG. 5), a refresh timer circuit 525 may be associated with multiple memory banks 510.

The core die stack 505 may include one or more oscillator circuits 530. In the example shown in FIG. 5, core die stack 505 includes four oscillator circuits. The oscillator circuits 530 may provide a periodic signal to multiple refresh timer circuits 525 via conductive paths 535. In some embodiments, conductive paths 535 may include conductive traces contained within a single die of the core die stack 505. In other embodiments, conductive paths 535 may extend between two or more die in the core die stack 505. In some embodiments, conductive paths 535 may include one or more TSVs. In the example shown in FIG. 5, each oscillator circuit 530 provides a periodic signal to 32 refresh timer circuits 525. The oscillator circuits 530 may be included along the spines of the core die stack 505 as shown in FIG. 5. In other embodiments, the oscillator circuits 530 may be included in another area of the core die stack 505. The oscillator circuits 530 may operate independently of one another in some embodiments, but may include one or more fuses to allow the oscillator circuits 530 to be trimmed such that the oscillator circuits 530 have the same cycle time and/or are synchronized.

Figure 6:
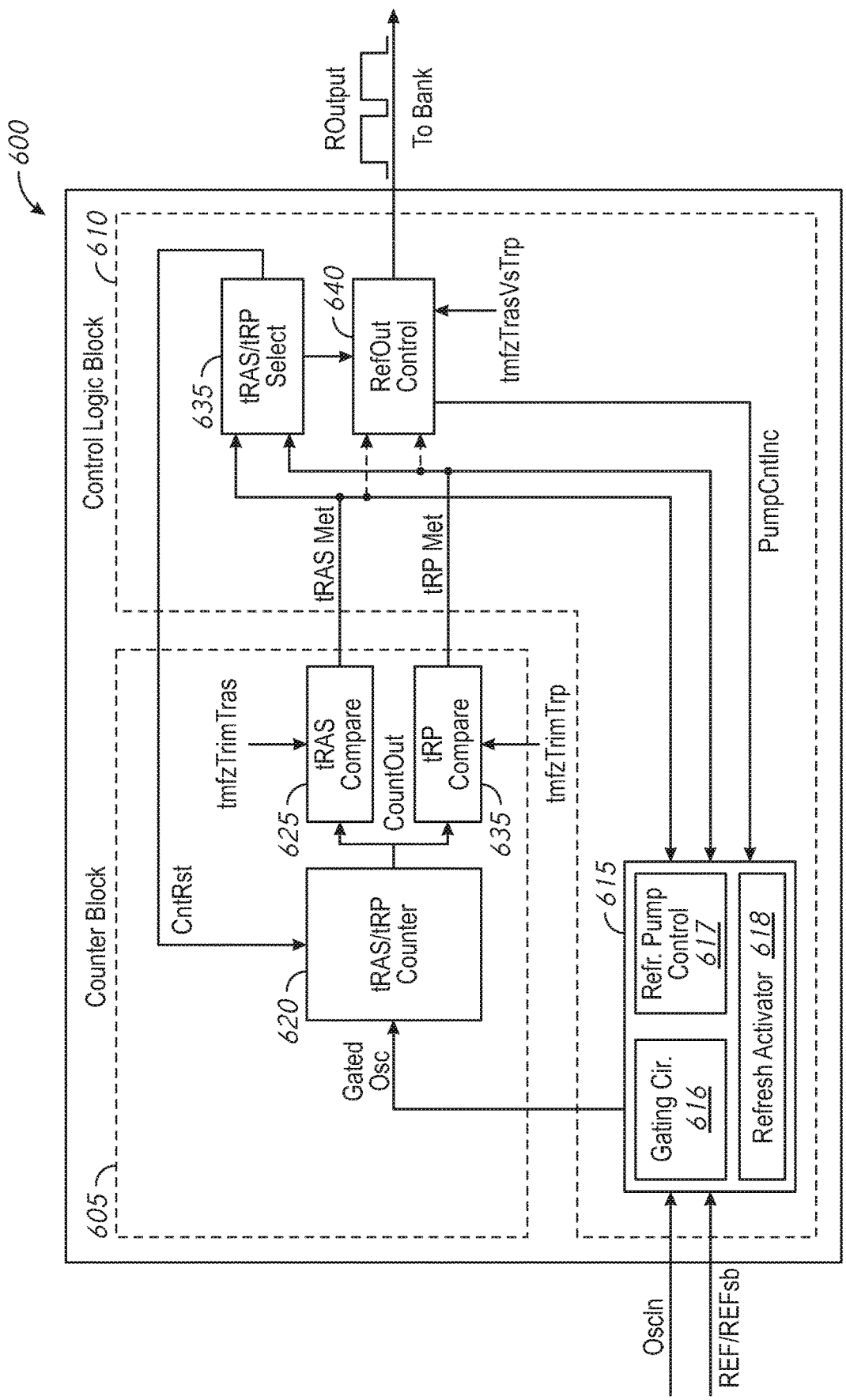
FIG. 6 is a block diagram of a refresh timer circuit according to an embodiment of the disclosure.

FIG. 6 is a block diagram of a refresh timer circuit 600 according to an embodiment of the disclosure. The refresh timer circuit 600 may include a counter block 605 and a control logic block 610. The control logic block may include a refresh activation control circuit 615 that receives a periodic signal (OscIn) from an oscillator circuit (e.g., oscillator circuit 128, 415, or 530). The refresh activation control circuit 615 may further receive a refresh command signal (REF/REFsb). The refresh command signal may be provided by a command decoder (e.g., command decoder 106) to cause a refresh operation to be performed. The refresh activation control circuit 615 may include a refresh activator circuit 618, which may provide an active control signal to a tRAS/tRP select circuit 635 upon receipt of the refresh command. In response to the active control signal, the tRAS/tRP select circuit 635 may provide an active control signal to a refresh output control circuit (RefOut) 640, which may cause the RefOut control circuit 640 to switch a refresh signal (ROutput) provided to a memory bank to an active state (e.g., logic high).

In some embodiments, the refresh command may include a number of pumps to be performed during the refresh operation. In some embodiments, the number of pumps may be set number (e.g., 3). The refresh activation control circuit 615 may include a refresh pump control circuit 617. The refresh pump control circuit 617 may count a number of pumps completed by the refresh timer circuit 600 and compare it to the number of pumps to be performed for the refresh operation. In some embodiments, the refresh pump control circuit 617 may include a counter circuit and a comparator circuit.

The refresh activation control circuit 615 may include a gating circuit 616 that may provide a periodic signal (GatedOsc) to a tRAS/tRP counter circuit 620 included in the counter block 605. Receipt of GatedOsc may enable the tRAS/tRP counter circuit 620. In some embodiments, GatedOsc may be based on the OscIn provided by an oscillator circuit. For example, the gating circuit 616 may gate OscIn, that is, provide an active OscIn as an active GatedOsc to the tRAS/tRP counter or prevent an active OscIn from being provided to the tRAS/tRP counter circuit 620 until a refresh command signal is received. Gating the periodic signal may reduce current draw by the refresh timer circuit 600 between refresh operations in some applications. It may also eliminate the need for a counter enable signal in some embodiments.

The tRAS/tRP counter circuit 620 (e.g., "the counter") begins counting in response to an active GatedOsc. In some embodiments, the counter 620 may be a four-bit counter. However, the counter 620 may be any number of bits. For example, the counter 620 may count a sufficient number of bits to count to a value equal to tRAS+tRP divided by a frequency of GatedOsc. The count output of the counter 620 (CountOut) may be provided to two compare circuits: tRAS compare circuit 625 and tRP compare circuit 630. The tRAS compare circuit 625 may compare the output of the counter 620 to a value equal to the row active time (tRAS). When the output of the counter 620 is equal to tRAS, tRAS compare circuit 625 outputs an active signal (tRAS Met) indicating a time equivalent to tRAS has elapsed. The tRP compare circuit 630 may compare the output of the counter 620 to a value equal to the row precharge time (tRP) or a value equal to tRAS+tRP in other embodiments. When the output of the counter 620 is equal to tRP (or tRAS+tRP, depending on the embodiment), tRP compare circuit 630 outputs an active signal (tRP Met) indicating a time equivalent to tRP or tRAS+tRP has been met. In some embodiments, tRAS Met and tRP Met signals may be active high signals. For example, the output of the compare circuits 625 and 630 may switch to a logic high state when tRAS and tRP have elapsed, respectively. In some embodiments, tRAS Met and tRP Met may be pulsed signals, that is, the signals are active (e.g., logic high) for only a limited number of clock cycles (e.g., 1 cycle, 2 cycles).

The tRAS Met and tRP Met signals may be provided to a tRAS/tRP select circuit 635 (e.g., "select circuit"). The select circuit 635 may provide an active reset signal (CntRst) to reset the counter 620. If the tRP compare circuit 630 is configured to output tRP Met when the output of the counter 620 is equal to tRP, then the select circuit 635 may send an active CntRst after receipt of tRAS Met and again after receipt of tRP Met. If the tRP compare circuit 630 is configured to output tRP Met when the output of the counter 620 is equal to tRAS+tRP, then the select circuit 635 may send an active CntRst only after both tRAS Met and tRP Met have been received.

As mentioned above, control logic block 610 may include a refresh output control circuit (RefOut) 640. RefOut control circuit 640 may provide a refresh signal (ROutput) to a memory bank or multiple memory banks. After receipt of a refresh command, RefOut control circuit 640 may transition ROutput to an active state (e.g., logic high, active high). In some embodiments, the RefOut control circuit 640 transitions ROutput to an active state responsive to an active control signal from the select circuit 635. The active control signal from the select circuit 635 may be provided responsive to an active control signal from the refresh activator circuit 618 of the refresh activation control circuit 615 as discussed previously.

In some embodiments, RefOut control circuit 640 receives signals tRAS Met and tRP Met as well as a control signal from the select circuit 635. The control signal from the select circuit 635 may dictate which of tRAS Met and tRP Met causes the RefOut control circuit 640 to switch the state of ROutput. First, the control signal from the select circuit 635 will select the tRAS Met signal. When an active tRAS Met signal is provided by the tRAS compare circuit 625, the RefOut control circuit 640 may transition ROutput to a logic low (e.g., inactive low) in response. After an active tRAS Met signal is provided, the select circuit 635 causes the RefOut Control circuit 640 to respond to the tRP Met signal. When an active tRP Met signal is provided by the tRP compare circuit 630, the RefOut control circuit 640 may transition ROutput to a logic high in response in some embodiments.

In some embodiments, in response to receiving the active tRAS Met signal, the RefOut control circuit 640 may provide an active signal (PumpCntInc) to the refresh pump control circuit 617 of the refresh activation control circuit 615. The active PumpCntInc may indicate that a pump of the refresh operation has been completed and increments a pump counter included with the refresh pump control circuit 617. If the refresh pump control circuit 617 determines that the requested or the number of pumps for the refresh operation has been met, the refresh pump control circuit 617 may provide an active control signal to the gating circuit 616. In response, the gating control circuit 616 may gate the OscIn signal, thus disabling the counter 620. The counter 620 may be disabled before the count has reached tRP or tRP+tRAS. Disabling the counter 620 may prevent tRP compare circuit 630 from providing an active tRP Met, thus preventing RefOut control circuit 640 from providing a logic high refresh signal until a subsequent refresh command is received by the refresh activation control circuit 615. In some embodiments, the refresh activator circuit 618 of the refresh activation control circuit 615 may provide an active control signal to the select circuit 635, which may then provide an active control signal to the RefOut control circuit 640. The active control signal from the select circuit 635 to the RefOut control circuit 640 may prevent the RefOut control circuit 640 from transitioning the refresh signal ROutput to a logic high state until a subsequent refresh command is received. In some embodiments, gating the periodic signal may cause the counter 620 to reset. In some embodiments, refresh activation control circuit 615 or the select circuit 635 may send a reset signal to the counter 620 at the end of a refresh operation.

In other embodiments, in response to receiving the active tRP Met signal, the RefOut control circuit 640 may provide the active PumpCntInc to the refresh pump control circuit 617 but may not transition the ROutput signal to the logic high state. If the refresh pump control circuit 617 determines that the requested or the number of pumps for the refresh operation has been met, the refresh pump control circuit 617 may provide an active control signal to the gating circuit 616. In response, the gating control circuit 616 may gate the OscIn signal, thus disabling the counter 620. ROutput may remain low until a subsequent refresh command has been received.

If the number of pumps has not been met, the refresh pump control circuit 617 may send an active signal to the refresh activator circuit 618. In response, the refresh activator circuit 618 may send a control signal to the select circuit 635. The select circuit 635 may provide an active control signal to the RefOut Control circuit 640, responsive to the active control signal from the refresh activator circuit 618. The active control signal from the select circuit 635 may cause the RefOut Control circuit 640 to again transition the refresh signal ROutput to logic high, thus beginning a subsequent pump of the refresh operation.

In some embodiments, the refresh activation control circuit 615 may add delay to when an active GatedOsc is provided following receipt of a refresh command. Waiting to provide an active GatedOsc may stabilize the refresh signal in some applications. In some embodiments, the refresh activation control circuit 615 may include a two-cycle synchronizer circuit, which may be used to add up to two cycles of delay. For example, when a refresh command is received, the refresh activation control circuit 615 may wait one cycle plus any partial cycle if the command was received between cycles before passing the periodic signal to the counter 620.

A refresh command may indicate that one or more memory banks may be refreshed at a time. When several memory banks are to be refreshed at once, there may be too much current draw in the memory to refresh all the memory banks simultaneously in some applications. In some embodiments, a command decoder may delay providing the refresh commands to the refresh timer circuits of each memory bank to be refreshed in order to stagger the refresh operation. Staggering the refresh operations of the individual banks may reduce the current draw. In some embodiments, the refresh activation control circuit 615 may control bank stagger rather than the command decoder. When a refresh command is received by the refresh timer circuits of multiple memory banks (e.g., multi-bank refresh command), the refresh command may indicate to the refresh timer circuit that multiple memory banks are to be refreshed. Each refresh activation control circuit 615 may include a stagger delay, which may be applied when a multi-bank refresh command is received. In some embodiments, the refresh activator 618 includes a delay. The delay provided by the refresh activator 618 may delay the refresh activator circuit 618 from providing an active control signal to the select circuit 635 and may cause the gating circuit 616 to delay providing the periodic signal to the counter 620. Some or all of the refresh timer circuits 600 may include different delays in order to stagger refresh operations across the memory banks over time.

In some embodiments, RefOut control circuit 640 may not receive signals tRAS Met and tRP Met. Rather, the select circuit 635 may provide control signals that indicates when tRAS Met and tRP Met signals have been received. Similar to described above, RefOut control circuit 640 may provide a low logic refresh signal and PumpCntInc to the refresh activation control circuit 615 when the select circuit 635 indicates tRAS Met has been received. RefOut control circuit 640 may provide a high logic refresh signal when the select circuit 635 indicates tRP Met has been received.

In some embodiments, tRAS compare circuit 625 and tRP compare circuit 630 may include fuses tmfzTrimTras and tmfzTrimTrp, respectively. The fuses may be used during production and/or testing to fine-tune the value of tRAS and tRP. In some embodiments, RefOut control circuit 640 may include a fuse tmfzTrasVsTrp. This may allow adjustment of the delay by providing an extra delay between tRAS and tRP. In some embodiments, the adjustment of the delay favors tRAS or tRP at the expense of the other, thus the overall period of the refresh signal is unchanged. Further-more, in some embodiments, the tRAS compare circuit 625 and tRP compare circuit 630 may be configured to compare the output of the counter 620 to values other than tRAS and tRP, respectively. For example, in some applications and/or memory types, a different refresh timing protocol may be used.

Figure 7:
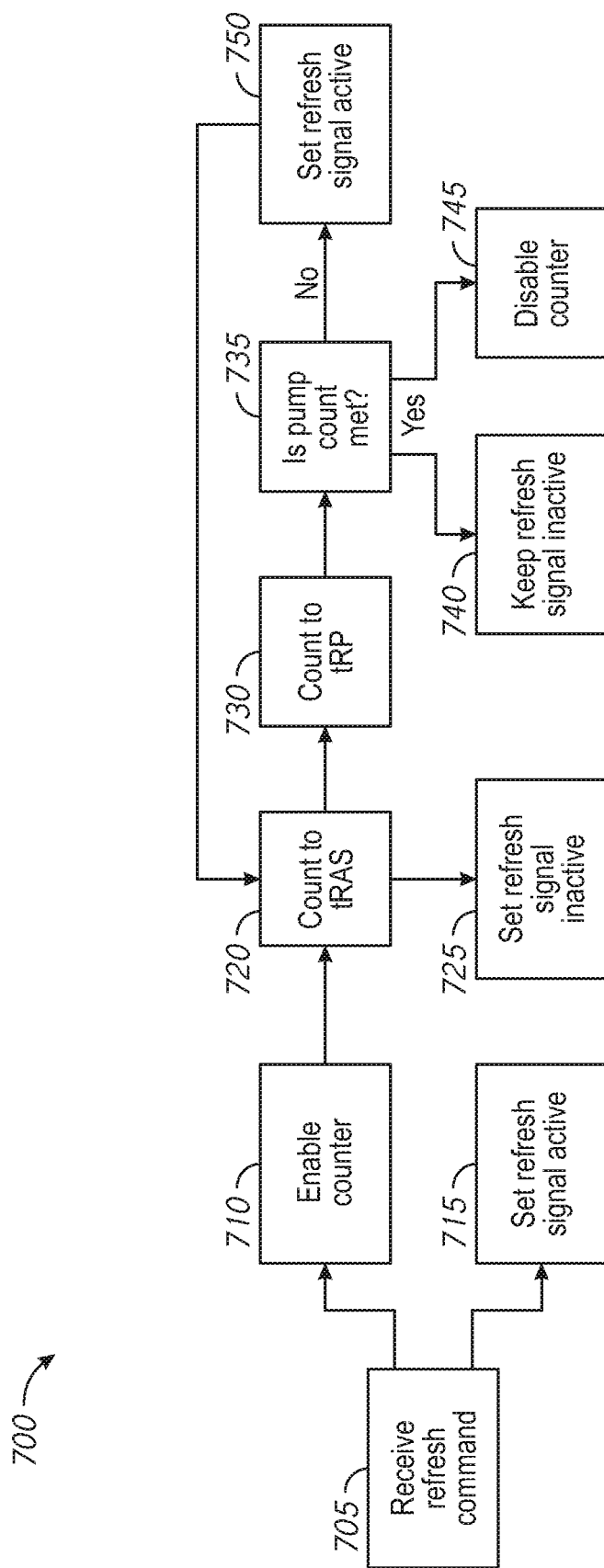
FIG. 7 is an operational flow chart of a refresh timer circuit according to an embodiment of the disclosure.

FIG. 7 is an operational flow chart 700 of a refresh timer circuit according to an embodiment of the disclosure. A refresh timer circuit, such as refresh timer circuit 600, may operate in the manner shown in flow chart 700 in some embodiments. As previously mentioned, a refresh signal from a refresh timer circuit is initially inactive (e.g., logic low) prior to receipt of a refresh command. At block 705, a refresh command may be received by the refresh timer circuit. The refresh command may have been received from a command decoder in some embodiments. Responsive to receiving the refresh command, the refresh timer circuit may output an active refresh signal (e.g., logic high) at block 715. Further in response to the refresh command, the refresh timer circuit may enable a counter at block 710. In some embodiments, the counter may be enabled by passing a periodic signal from an oscillator circuit to the counter.

The refresh timer circuit may count until a first value has been reached. For example, a value equivalent to a row active signal time (tRAS) as shown at block 720. Responsive to the time tRAS elapsing, the refresh timer circuit may output an inactive refresh signal at block 725. After tRAS has elapsed, the refresh timer circuit may count until a second value has been reached. For example, a value equivalent to a row precharge time (tRP) as shown at block 730. In some embodiments, the determination that tRAS and tRP have elapsed may be performed by comparator circuits.

In some embodiments, responsive to tRP elapsing, the refresh timer circuit may determine whether a pump count has been met at block 735. That is, the value of a pump counter may be compared to a number of pumps included in a refresh operation. In some embodiments, the pump count may be the same for every refresh operation in a memory. In some embodiments, the refresh command may include a number of pumps to be performed during the refresh operation, and the number of pumps may vary between refresh commands. In some embodiments, the pump count will be determined by a refresh activation control circuit. If the pump count is met, the refresh timer circuit may keep the refresh signal output in an inactive state at block 740. The refresh timer circuit may further disable the counter at block 745 when the pump count is met. If the pump count is not met, the refresh timer circuit outputs an active refresh signal at block 750. The refresh timer circuit may return to block 720 and count to tRAS for another refresh pump.

In another embodiment, responsive to tRAS elapsing, the refresh timer circuit may determine whether a pump count has been met at block 735. If the pump count is met, the refresh timer circuit may keep the refresh signal output in an inactive state as shown in block 740. The refresh timer circuit may further disable the counter at block 745 when the pump count is met. If the pump count is not met, the refresh timer circuit outputs an active refresh signal at block 750 after it has counted to tRP at block 730 and return to block 720 and count to tRAS for another refresh pump.

In some embodiments, refresh timer circuit may reset the counter used to count to tRAS and tRP. In some embodiments, the refresh timer circuit may be reset after blocks 720, 730, and 745. In some embodiments, the counter may be reset after blocks 730 and 745.

While the blocks of flow chart 700 are sequentially numbered for clarity, it is understood that some blocks may be performed simultaneously. For example, blocks 710 and 715 may be performed simultaneously. In another example, blocks 740 and 745 may be performed simultaneously. Additionally, in some embodiments, the blocks may be performed in an order different than previously described with reference to the flow chart 700.

Figure 8:
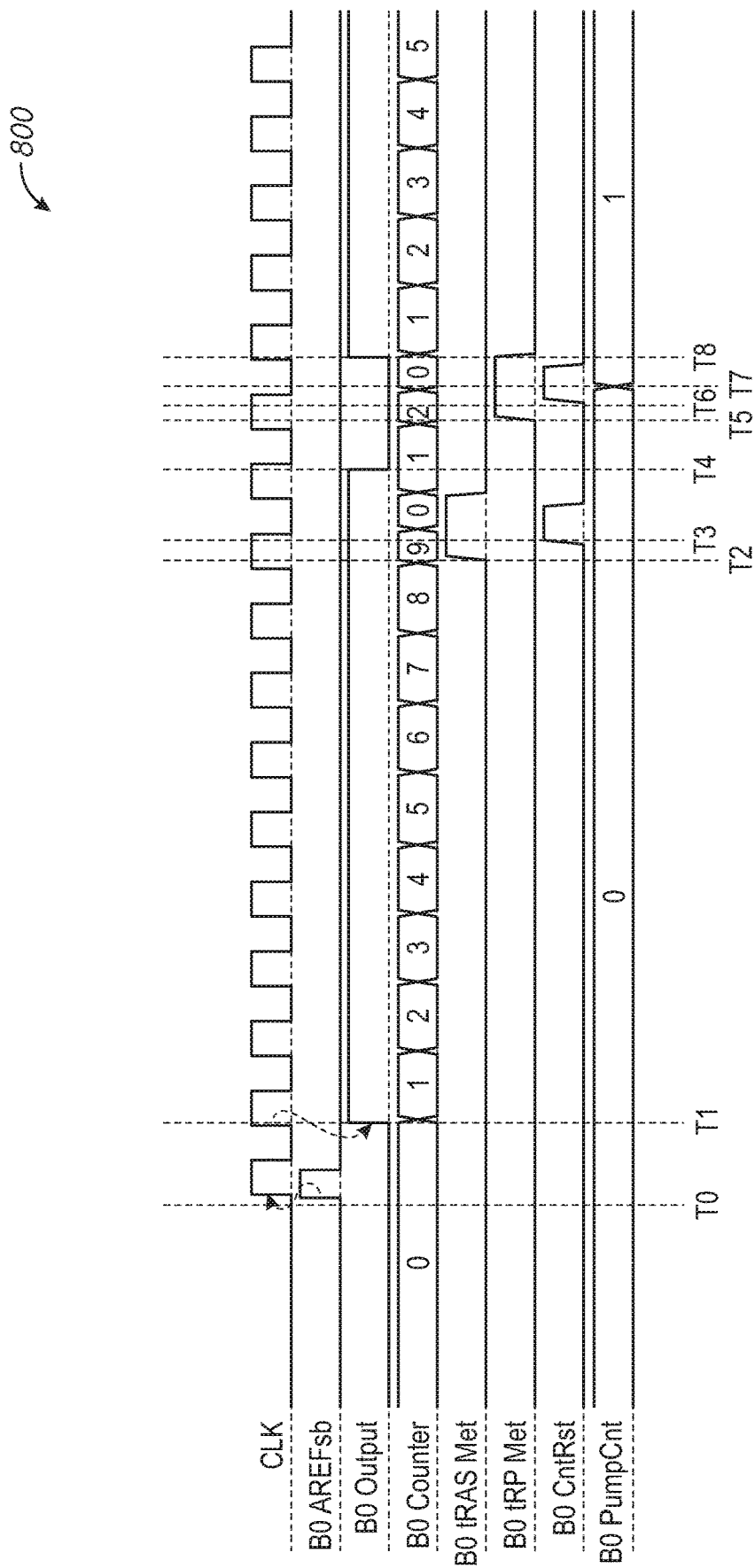
FIG. 8 is a timing diagram of a refresh operation according to an embodiment of the disclosure.

FIG. 8 is a timing diagram 800 of a refresh operation for a memory bank (B0) according to an embodiment of the disclosure. The refresh operation shown in timing diagram 800 may be performed by a memory including an oscillator and a refresh timer circuit according to an embodiment of the disclosure. Timing diagram 800 may reflect the operations described in operational flow chart 700 in some embodiments. The refresh operation shown in timing diagram 800 is for exemplary purposes only and should not be interpreted to limit the principles of the disclosure. Particularities in the timing diagram may vary depending on specifications of a given memory (e.g., required oscillation frequency, synchronizing on rising or falling clock edge, number of pumps per refresh operation, synchronization cycle delays). For example, as shown in FIG. 8, tRAS is 47 ns and tRP is 8 ns. However, tRAS and tRP may be different for different memories. The values of tRAS and tRP may depend on the memory type and/or standards (e.g., JEDEC) that may apply.

The timings of several signals are shown in FIG. 8. CLK may be a periodic signal from an oscillator circuit (e.g., oscillator circuit 130). AREF-sb may be a refresh command signal. The refresh command signal may be received from a command decoder (e.g., command decoder 106). Although the CLK is shown as starting after 10 ns in timing diagram 800, CLK may be continuous from 0 ns. Output may be the output refresh signal by a refresh timer circuit (e.g., refresh timer circuit 600). Counter may be the output of a tRAS/tRP counter circuit (e.g., counter circuit 620). tRAS Met may be the output of a tRAS compare circuit (e.g., compare circuit 625). tRP Met may be the output of a tRP compare circuit (e.g. compare circuit 630). CntRst may be a counter reset signal provided by a tRAS/tRP select circuit (e.g., select circuit 635). PumpCnt may be a value of a pump counter included in a refresh activation control circuit (e.g., refresh activation control circuit 615). PumpCnt may be incremented upon receipt of a PumpCntInc signal (not shown) from a RefOut control circuit (e.g. RefOut control circuit 640).

At time T0, AREF-sb changes states to produce a high pulse, indicating receipt of a refresh command. Responsive to the refresh command, on the next rising clock edge at time T1, the refresh signal Output goes high and the Counter begins to indicate a count value based, at least in part, on CLK. At time T2, tRAS Met changes states to produce a pulsed high signal indicating tRAS has elapsed, responsive to Counter indicating a value equal to tRAS. Responsive to the tRAS Met signal, CntRst changes states to produce a pulsed high signal to reset the Counter at time T3. Responsive to the tRAS Met signal, the refresh signal Output goes low at time T4. At time T5, when the Counter signal indicates a value of tRP, tRP Met changes states to generate a pulsed high signal. Responsive to the tRP Met signal, at time T6, CntRst changes states to generate a pulsed high signal to reset the Counter. Also responsive to the tRP Met signal, at time T7, the PumpCnt is incremented. In the example shown in timing diagram 800, more than one pump is required, so responsive to the tRP Met signal, the refresh signal Output returns to high at time T8. Had the pump count been met, refresh signal Output would have remained low, Counter and PumpCnt would have returned to zero, and tRAS Met, tRP Met, and CntRst would have remained low. The signals would have remained in these states until the receipt of a subsequent refresh command. Although FIG. 8 illustrates timing signals for a single bank, it is understood that a memory including memory bank (B0) may include additional memory banks. The additional memory banks may have timing diagrams similar to memory bank (B0) in some embodiments.

The apparatuses and methods described herein may reduce the die area dedicated to refresh timing components, reduce production time, and/or reduce testing time. For example, a traditional timing array included with each memory bank of a 128-bank HBM may require 1,024 testmode/fuse bits and may require over 30 minutes to trim. An oscillator circuit and refresh timer circuit implemented in accordance with the principles of the present disclosure may require approximately 16-32 testmode/fuses and may be trimmed in approximately one minute or less in some embodiments. In some applications, the reduction in fuses may contribute to the reduced die area dedicated to refresh timing components in a memory.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
   a memory bank;
   an oscillator circuit configured to output a periodic signal;
   a refresh timer circuit configured to receive the periodic signal and provide a refresh signal to the memory bank, wherein the refresh timer circuit is further configured to:
   responsive to a refresh command, enable a counter circuit, wherein the counter circuit outputs a count based on the periodic signal;
   responsive to the refresh command, set the refresh signal to an active state;
   responsive to the counter circuit outputting a count equal to a row active signal time, set the refresh signal to an inactive state;
   responsive to the counter circuit outputting a count equal to a row precharge time, increment a pump counter; and
   responsive to a pump count based on the pump counter not being met, set the refresh signal to the active state and reset the counter circuit.

2. The apparatus of claim 1, further comprising a second memory bank, wherein the second memory bank receives a second refresh signal from a second refresh timer circuit, wherein the second refresh timer circuit is configured to receive the periodic signal from the oscillator circuit.

3. The apparatus of claim 2, further comprising a command decoder, wherein the command decoder is configured to provide refresh commands to the refresh timer circuit and the second refresh timer circuit.

4. The apparatus of claim 3, wherein the refresh timer circuit and the second refresh timer circuit are configured to stagger refresh operations of the memory bank and the second memory bank when simultaneous refresh commands are received.

5. The apparatus of claim 3, wherein the refresh timer circuit and the second refresh timer are located on a core die in a high bandwidth memory and the command decoder is located on a controller die of the high bandwidth memory.

6. The apparatus of claim 1, wherein the oscillator circuit is configured to provide the periodic signal to a plurality of refresh timer circuits.

7. The apparatus of claim 1, further comprising a second memory bank, wherein the second memory bank receives the refresh signal from the refresh timer circuit.

8. An apparatus comprising:
   a refresh activation control circuit configured to receive a periodic signal and a refresh command;
   a counter circuit configured to receive the periodic signal from the refresh activation control circuit and output a count based on the periodic signal;
   a first compare circuit configured to compare the count to a first value and output a first met signal when the count equals the first value;
   a second compare circuit configured to compare the count to a second value and output a second met signal when the counter equals the second value;
   a select circuit configured to receive the first met signal and the second met signal and reset the counter circuit responsive to at least one of the first met signal and the second met signal; and
   an output control circuit configured to output a refresh signal, wherein the output control circuit changes the refresh signal to an active state responsive to the refresh command and changes the refresh signal to an inactive state responsive to the first met signal.

9. The apparatus of claim 8, wherein the refresh activation control circuit is further configured to count a number of pumps in a refresh operation and the output control circuit is further configured to provide a pump count increment signal to the refresh activation control circuit responsive to the first met signal.

10. The apparatus of claim 9, wherein when the number of pumps in the refresh operation is equal to a required number of pumps, the refresh activation control circuit is configured block the periodic signal to the counter circuit and provide a control signal to the output control signal to keep the refresh signal in the inactive state until a subsequent refresh command is received.

11. The apparatus of claim 10, wherein the required number of pumps is equal for every refresh operation.

12. The apparatus of claim 10, wherein the required number of pumps is indicated in the refresh command.

13. The apparatus of claim 8, wherein the output control circuit is further configured to change the refresh signal to the active state responsive to the second met signal.

14. The apparatus of claim 13, wherein the select circuit is further configured to provide a control signal to the output control circuit, wherein the control signal dictates whether the output control circuit changes a state of the refresh signal responsive to the first met signal or the second met signal.

15. The apparatus of claim 8, wherein the first compare circuit includes a first fuse configured to fine-tune the first value.

16. The apparatus of claim 8, wherein the output control circuit includes a fuse configured to adjust a value between the first value and the second value.

17. An apparatus, comprising:
a core die including:
   a first memory bank;
   a second memory bank;
   a first refresh timer circuit associated with the first memory bank;
   a second refresh timer circuit associated with the second memory bank, wherein each of the first refresh timer circuit and second refresh timer circuit include a control block and a counter block,
   wherein the counter block is configured to:
      generate a count based on a periodic signal;
      provide a first signal responsive to the count reaching a first value; and
      provide a second signal responsive to the count reaching a second value;
   wherein the control block is configured to:
      provide the periodic signal to the counter block;
      provide an active refresh signal responsive to a refresh command; and
      provide a number of pumps of a refresh operation responsive to the first signal and the second signal; and
an oscillator circuit configured to provide the periodic signal to the first refresh timer circuit and the second refresh timer circuit.

18. The apparatus of claim 17, wherein the first value is a row active signal time.

19. The apparatus of claim 17, wherein the second value is a row precharge time and the control block is configured to reset the count of the counter block after the first signal and again after the second signal.

20. The apparatus of claim 17, wherein the second value is a row active signal time plus a row precharge time and the control block is configured to reset the count of the counter block after the second signal.

21. The apparatus of claim 17, wherein the control block is configured to block the periodic signal from the counter block until the refresh command is received.

* * * * *